United States Patent
Kai et al.

(10) Patent No.: US 7,459,327 B2
(45) Date of Patent: Dec. 2, 2008

(54) METHOD FOR MANUFACTURING MICRO LENSES INCLUDING UNDERLAYER FILM AND LENS FILM ETCHING STEPS

(75) Inventors: Seiji Kai, Gifu (JP); Ryouji Matsui, Gifu (JP); Tetsuya Yamada, Gifu (JP); Tsutomu Imai, Gifu (JP); Kazuyuki Takegawa, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 435 days.

(21) Appl. No.: 10/533,030

(22) PCT Filed: Apr. 16, 2004

(86) PCT No.: PCT/JP2004/005487

§ 371 (c)(1),
(2), (4) Date: Apr. 26, 2005

(87) PCT Pub. No.: WO2004/093196

PCT Pub. Date: Oct. 28, 2004

(65) Prior Publication Data

US 2006/0151773 A1    Jul. 13, 2006

(30) Foreign Application Priority Data

Apr. 16, 2003    (JP) .............................. 2003-111976

(51) Int. Cl.
*H01L 21/00*    (2006.01)
*H01L 31/062*    (2006.01)

(52) U.S. Cl. ....................... 438/48; 257/294

(58) Field of Classification Search ................. 257/222, 257/232, 290, 294; 438/16, 60, 69–71, 75, 438/48
See application file for complete search history.

(56) References Cited

U.S. PATENT DOCUMENTS

| | | | |
|---|---|---|---|
| 5,371,397 A | 12/1994 | Maegawa et al. | |
| 6,030,852 A * | 2/2000 | Sano et al. | 438/69 |
| 6,310,370 B1 | 10/2001 | Inoue et al. | |
| 2001/0036014 A1* | 11/2001 | Sasano et al. | 359/619 |
| 2002/0003230 A1 | 1/2002 | Maruyama | |
| 2003/0168678 A1* | 9/2003 | Konishi | 257/290 |
| 2005/0110052 A1* | 5/2005 | Konishi | 257/222 |

FOREIGN PATENT DOCUMENTS

JP    04-115678    4/1992

(Continued)

OTHER PUBLICATIONS

U.S. Appl. No. 10/382,413.

(Continued)

*Primary Examiner*—David Vu
*Assistant Examiner*—Andres Lopez Esquerra
(74) *Attorney, Agent, or Firm*—Hogan & Hartson LLP

(57) ABSTRACT

A solid-state imager is disclosed wherein isolation regions (4) are covered with power supply lines (8), a light-transmitting lens film (24) whose surface forms continuous convex portions above the isolation regions (4) convex towards channel regions (5) is provided, and a light-transmitting material having a refractive index lower than that of the lens film (24) is provided over the lens film (24).

3 Claims, 8 Drawing Sheets

FOREIGN PATENT DOCUMENTS

| | | | |
|---|---|---|---|
| JP | 06-125070 | | 5/1994 |
| JP | 9-27608 | * | 1/1997 |
| JP | 09-027608 | | 1/1997 |
| JP | 2000-091548 | | 3/2000 |
| JP | 2000-106425 | | 4/2000 |
| JP | 2001-189443 | | 7/2001 |
| JP | 2003-179221 | | 6/2003 |
| JP | 2003-264284 | | 9/2003 |

OTHER PUBLICATIONS

U.S. Appl. No. 11/025,618.

* cited by examiner

METHOD FOR MANUFACTURING MICRO LENSES INCLUDING UNDERLAYER FILM AND LENS FILM ETCHING STEPS

TECHNICAL FIELD

The present invention relates to a solid state imager with improved light receiving efficiency, and a manufacturing method thereof.

BACKGROUND ART

FIG. 15 is a plan view showing an outline of a construction of a conventional frame transfer type solid state imager. The frame transfer type solid state imager 1 comprises; an imaging section 1i, a storage section 1s, a horizontal transfer section 1h, and an output section 1d. The imaging section 1i comprises a plurality of vertical shift registers arranged in parallel with each other in the vertical direction, and each bit of these vertical shift registers constitutes a light receiving pixel. The storage section 1s comprises a plurality of vertical shift registers which continue to the plurality of vertical shift registers which constitute the imaging section 1i. The horizontal transfer section 1h comprises a single row horizontal shift register provided on the output side of the storage section 1s, each bit of which is associated with a line in the plurality of vertical shift registers. The output section 1d comprises enough capacity to receive the information charges output from the horizontal transfer section 1h.

In this construction, the information charges generated in the plurality of light receiving pixels which constitute the imaging section 1i are stored for a predetermined period in the light sensitive pixels, and are then transferred at high speed to the storage section 1s in response to a frame transfer clock ϕf. The information charges are then stored temporarily in the storage section 1s, and transferred sequentially line by line to the horizontal transfer section 1h in response to a vertical transfer clock ϕv. The information charges transferred to the horizontal transfer section 1h are then transferred to the output section 1d, sequentially pixel by pixel in response to a horizontal transfer clock ϕh, and converted sequentially to a voltage value and output as a picture signal Y(t).

FIG. 16 is a plan view showing a partial construction of the imaging section 1i, and FIG. 17 is a cross-sectional view along the line X-X in FIG. 16.

A P-type diffusion layer 3 which acts as the device region, is formed upon a primary surface of an N-type silicon substrate 2. A plurality of isolation regions 4 infused with high concentrations of P-type impurities are arranged in parallel a fixed distance apart in the surface region of this P-type diffusion layer 3. Between these isolation regions 4 are formed N-type diffusion layers, and a plurality of channel regions 5 which act as transfer channels for the information charges are formed. A plurality of polycrystalline silicon transfer electrodes 7 are arranged in parallel with each other on the plurality of channel regions 5 via a gate insulation film 6 made of thin silicon oxide, so as to extend in the direction transverse to the plurality of channel regions 5. Three-phase frame transfer clocks ϕf1 to ϕf3, for example, are applied to these transfer electrodes 7, and the state of the potential of the channel regions 5 is controlled by these clock pulses.

An interlayer insulating film made of the same material as the gate insulation film 6 is formed over the plurality of transfer electrodes 7, and a plurality of power supply lines 8 made of aluminum, for example, are arranged on the interlayer insulating film so as to cover the isolation regions 4. The plurality of power supply lines 8 connect to the transfer electrodes 7 via contact holes 11 formed at predetermined intervals in the interlayer insulating film, at those points where the isolation regions 4 and the transfer electrodes 7 intersect. For example, in the case of three-phase drive, a contact hole is provided for every third transfer electrode 7, and each power supply line 8 is connected to every third transfer electrode. An additional interlayer insulating film 9 is formed so as to cover the plurality of power supply lines 8, and furthermore a protective film 10 made of silicon nitride is formed over this interlayer insulating film 9.

DISCLOSURE OF THE INVENTION

In the case of the solid state imager described above, a plurality of power supply lines 8 are formed on the light receiving region so as to cover the isolation regions 4. The aluminum material used in the plurality of power supply lines 8 typically has a characteristic of reflecting light. Consequently, of the light which is uniformly incident onto the light sensitive region, the light which is incident onto the power supply lines 8 is reflected at the surface of the power supply lines 8. Accordingly, a problem occurs in that the light which is incident onto the power supply lines 8 is not guided to the channel regions 5, and not incorporated as information charges.

The present invention comprises: a semiconductor substrate; a plurality of channel regions arranged in parallel with each other a fixed distance apart on a principal surface of the semiconductor substrate; a plurality of isolation regions provided in gaps between the plurality of channel regions; a plurality of transfer electrodes arranged above the semiconductor substrate so as to extend in a direction transverse to the plurality of channel regions; a plurality of power supply lines arranged over the plurality of transfer electrodes along the plurality of isolation regions; a light transmitting insulating film laminated onto the plurality of transfer electrodes so as to cover the plurality of power supply lines; and light transmitting upper and lower lens films laminated onto the insulating film, wherein a film thickness of the insulating film is thicker at a center of the isolation regions and thinner at a center of the channel regions, and the upper lens film is shaped such that a surface thereof forms continuous convex portions above the isolation regions convex towards the channel regions, and the upper lens film has a refractive index higher than that of a substance provided in a layer above the lens film.

Moreover, the manufacturing method of the present invention comprises: a first step for arranging a plurality of channel regions in parallel with each other a fixed distance apart on a principal surface of a semiconductor substrate, and forming a plurality of isolation regions in gaps between the plurality of channel regions; a second step for forming a plurality of transfer electrodes above the semiconductor substrate so as to extend in a direction transverse to the plurality of channel regions, and forming a plurality of power supply lines above the plurality of transfer electrodes so as to cover the isolation regions; a third step for laminating a light transmitting insulating film having a predetermined film thickness onto the plurality of transfer electrodes; a fourth step for forming a mask pattern which covers the plurality of power supply lines and extends along the plurality of channel regions on the insulating film; a fifth step for etching the insulating film anisotropically along the mask pattern, and thinning a film thickness of the insulating film along the plurality of channel regions; a sixth step for laminating a light transmitting lower lens film onto the insulating film; a seventh step for forming concave portions over the isolation regions by etch back processing of the lower lens film; and an eighth step for laminating a light transmitting upper lens film onto the lower lens film, wherein the upper lens film has a refractive index higher than that of a substance provided in a layer above the upper lens film.

According to the present invention, the surface of the upper lens film fulfills the same function as a prism, and can guide the light incident over the power supply lines, to the channel regions. As a result, the light irradiated onto the light receiving region can be taken into the pixel region with a high level of efficiency, and converted into information charges with a high level of light sensitivity.

BEST MODE FOR CARRYING OUT THE INVENTION

Figure 1:
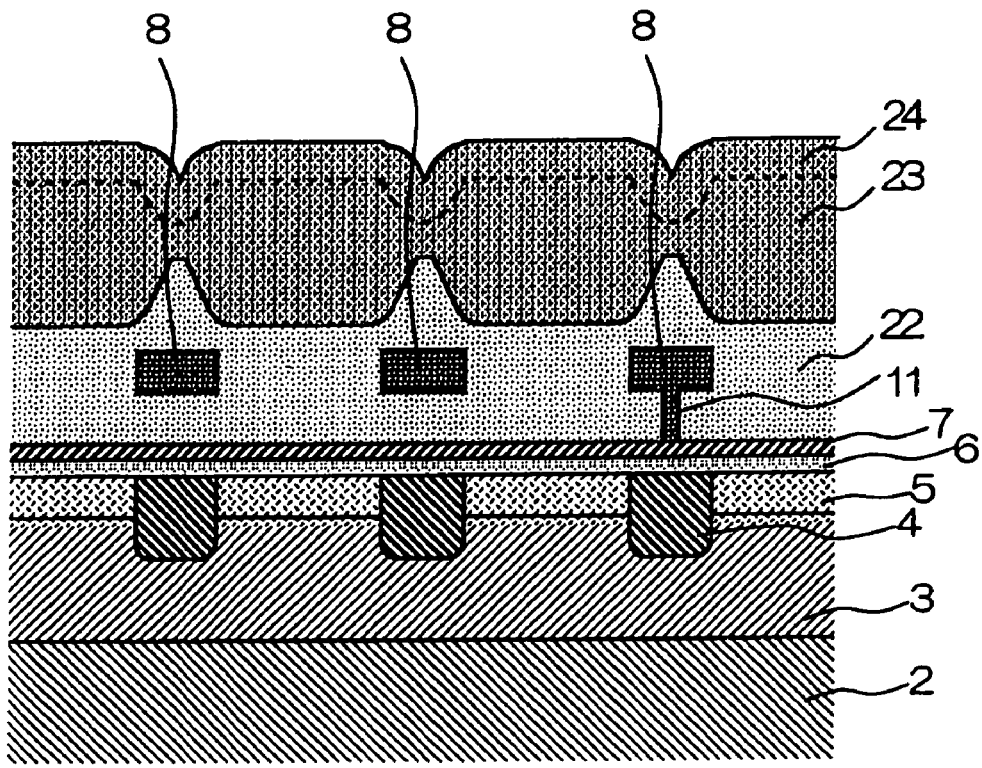
FIG. 1 is a cross-sectional view describing an embodiment of the present invention.
Figure 17:
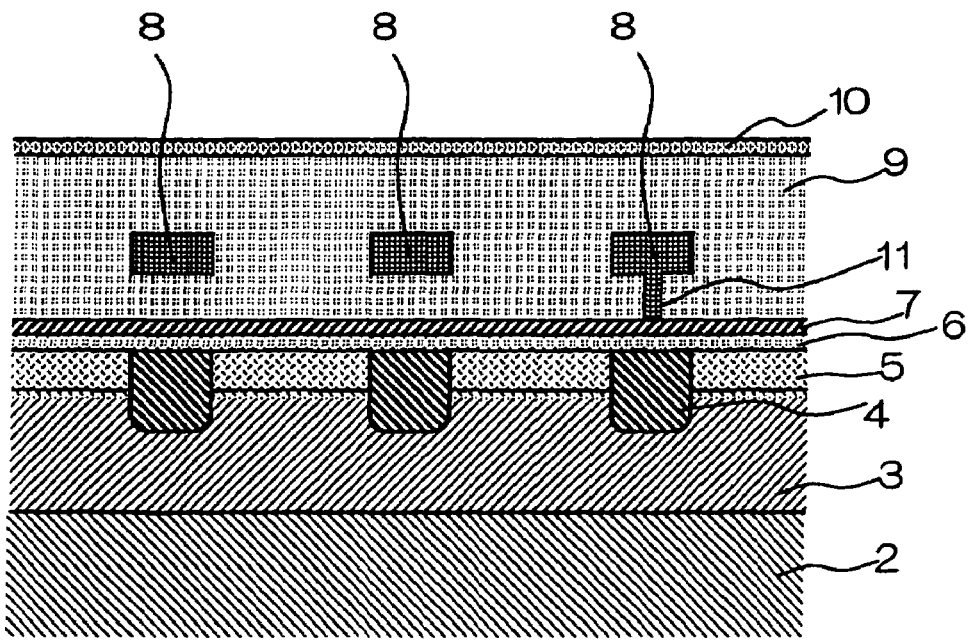
FIG. 17 is a cross-sectional view describing the construction of the imaging section.

The construction in FIG. 1 shows an embodiment of a solid state imager of the present invention, showing the same part as FIG. 17. In this diagram, an N-type silicon substrate 2, a P-type diffusion layer 3, isolation regions 4, channel regions 5, a gate insulation film 6, transfer electrodes 7, and power supply lines 8 are the same as those shown in FIG. 17. The present invention is characterized in that a power supply line 8 covers a plurality of transfer electrodes 7, and the surface of an upper lens film 24 forms continuous convex portions above the isolation regions 4 convex towards the channel regions 5.

The upper lens film 24 is made of an optically transparent material which has a refractive index higher than that of a substance above the upper lens film 24. Moreover, although not shown in FIG. 1, when forming a protective film over the upper lens film 24, the protective film is formed from an optically transparent material so as to cover the entire surface of the upper lens film 24, and is given a flat surface.

For example, it is possible to form the upper lens film 24 from silicon oxide with a refractive index of approximately 1.4 to 1.5, and then not form a protective film leaving air with a refractive index of 1, or it is possible to form the upper lens film 24 from silicon nitride with a refractive index of approximately 2, and then form the protective film from silicon oxide with a refractive index of approximately 1.4 to 1.5.

In the case of the present embodiment, the boundary surface between the upper lens film 24 and the protective film forms a gentle curved shape from near the center of the isolation region 4 to partway over the channel region 5, and forms a flat shape from one end of this curved shape towards the center of the channel region 5.

In this manner, by forming an upper lens film 24 which is light transmitting and whose surface forms continuous convex portions above the isolation regions 4 convex towards the channel regions 5, and having a light transmitting material with a refractive index lower than that of the upper lens film 24 over the upper lens film 24, the upper lens film 24 can function as a prism above the power supply lines 8, guiding the light incident over the power supply lines 8, to the channel regions 5. The surface of the upper lens film 24 forms a curved shape near the centers of the isolation regions 4, and in particular, the angle formed between the surface of the upper lens film 24 and the surface of the N-type silicon substrate 2 is set so as to increase as it nears the center portion of the power supply lines 8. As a result, the light which is incident vertically onto the surface of the N-type silicon substrate 2 is refracted to a greater degree by the upper lens film nearer the center portions of the power supply lines 8, and a greater amount of light can be guided efficiently into the channel regions 5.

Furthermore, if a light transmitting lower lens film 23 with a refractive index higher than that of an insulating film 22 is laminated onto the transparent insulating film 22 whose surface thickens progressively from the channel region 5 side towards the center of the isolation regions 4, the lower lens film 23 also functions as a prism above the power supply lines 8, enabling the light incident over the power supply lines 8 to be guided to the channel regions 5 with even better efficiency. For the lower lens film 23 also, the angle formed between the boundary surface of the lower lens film 23 and the insulating film 22, and the surface of the N-type silicon substrate 2 is set so as to increase as it nears the center portion of the power supply lines 8. As a result, the light which is incident vertically onto the surface of the N-type silicon substrate 2 is refracted to a greater degree by the lower lens film as the light nears the center portions of the power supply lines 8, and a greater amount of light can be guided efficiently into the channel regions 5.

In the present embodiment, silicon oxide film or silicon nitride film were given as an example of the material for the upper lens film 24 and the protective film, but the present invention is not limited to these materials. That is to say, the upper lens film 24 may be any material provided that the material has a refractive index higher than that of a substance above the upper lens film 24, and is optically transparent. Furthermore, in a case where a protective film is formed over the upper lens film 24, the upper lens film 24 should be made of a material which has a refractive index higher than that of the protective film, and which is optically transparent.

Moreover, for the lower lens film 23 also, an optically transparent material with a refractive index higher than that of the insulating film 22 is suitable, but the refractive index of the lower lens film 23 does not necessarily need to be higher than that of the insulating film 22. In addition, the upper lens film 24 and the lower lens film 23 do not necessarily need to be made of the same material.

Furthermore, by adjusting the angle of the curved shapes appropriately in accordance with the refractive indices of the upper and lower lens films and the other materials, it is possible to obtain a similar effect to that of the present embodiment. For example, when the light incident over the power supply lines 8 can be guided to the channel regions 5 to a sufficient degree by the upper lens film 24 functioning as a prism, it is possible to form the upper lens film 24, the lower lens film 23, and the insulating film 22 all from silicon oxide or silicon nitride.

Figure 2:
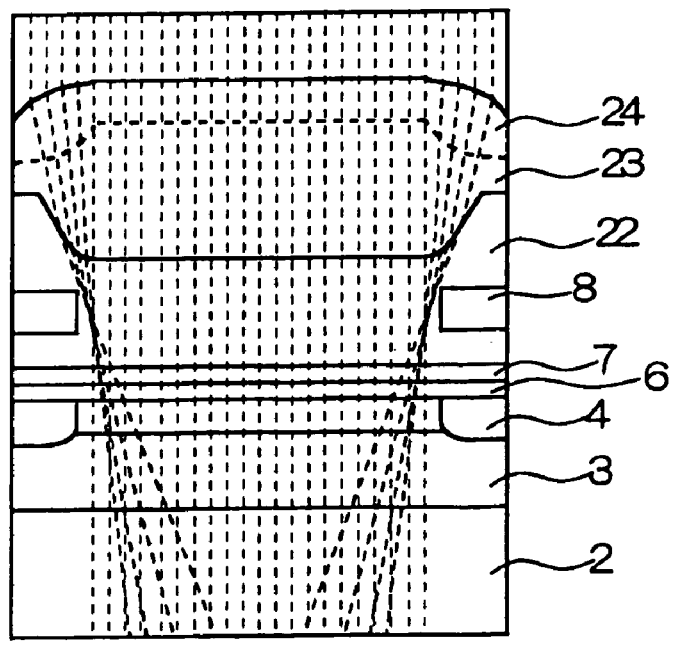
FIG. 2 is a diagram showing ray tracing for a case where the construction of the present invention is employed.

FIG. 2 is a diagram showing ray tracing for a case where the present embodiment is employed. In this manner the light incident over the power supply lines 8 is focused efficiently towards the channel region 5 side.

FIG. 3 through FIG. 13 are cross-sectional views of individual steps illustrating the solid state imager manufacturing method of the present invention. These diagrams show the same parts as shown in FIG. 1.

Figure 3:
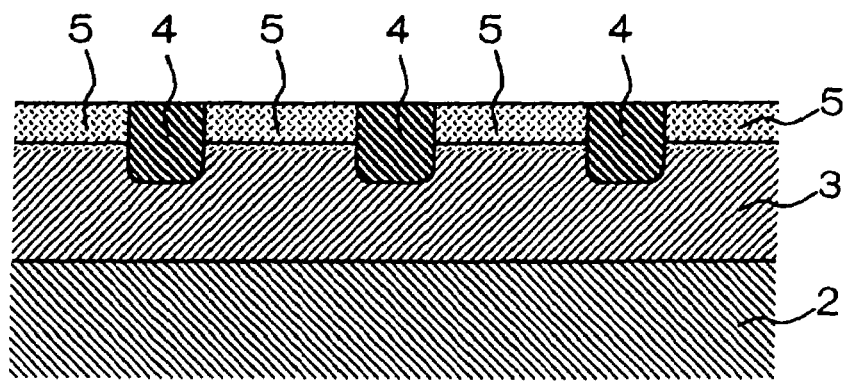
FIG. 3 is a cross-sectional view describing a first step in a solid state imager manufacturing method of the present invention.

Step 1: FIG. 3

The surface region of an N-type silicon substrate 2 is diffused with P-type impurities such as boron to form a P-type diffusion layer 3 which acts as the device region. The inside of this P-type diffusion layer 3 is then further infused selectively with P-type impurities to form isolation regions 4, and the gaps between the isolation regions 4 are infused with N-type impurities such as phosphorus to form an N-type diffusion layer which acts as the channel regions 5.

Figure 4:
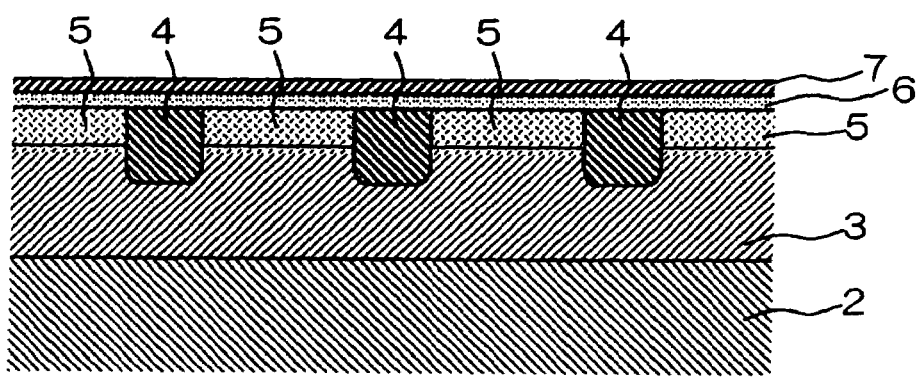
FIG. 4 is a cross-sectional view describing a second step in the solid state imager manufacturing method of the present invention.

Step 2: FIG. 4

The surface of the N-type silicon substrate 2 in which the isolation regions 4 and the channel regions 5 are formed, is subjected to thermal oxidation, thus forming a gate insulation film 6 made of silicon oxide. A polycrystalline silicon film is then formed over this gate insulation film 6 using a CVD (chemical vapor deposition) process. This polycrystalline silicon film is then patterned according to a predetermined shape which is transverse to the channel regions 5, thereby forming the transfer electrodes 7.

Figure 5:
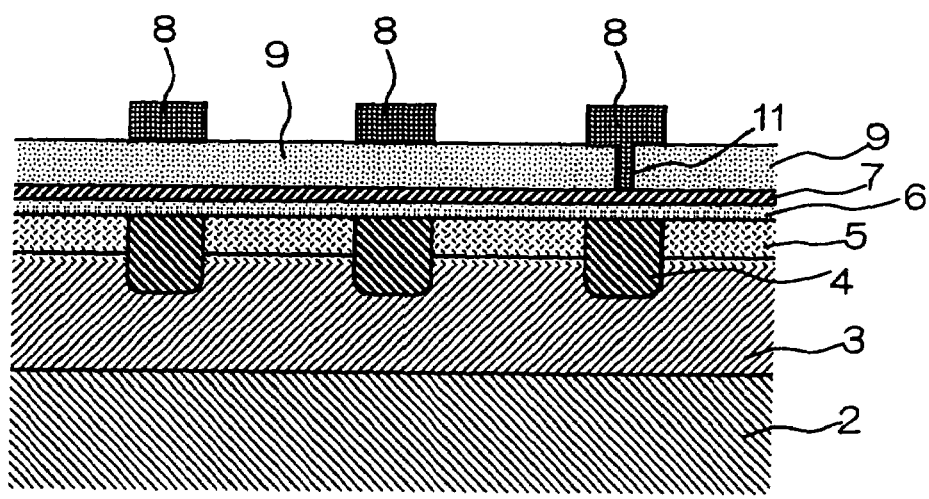
FIG. 5 is a cross-sectional view describing a third step in the solid state imager manufacturing method of the present invention.

Step 3: FIG. 5

Silicon oxide is laminated onto the transfer electrodes 7 using a CVD process, thus forming a first layer of insulating film. Contact holes 11 are formed in this first layer of insulating film at positions above the isolation regions 4. Aluminum is then laminated onto the first layer of insulating film, and patterned according to a predetermined shape to form the power supply lines 8.

Figure 6:
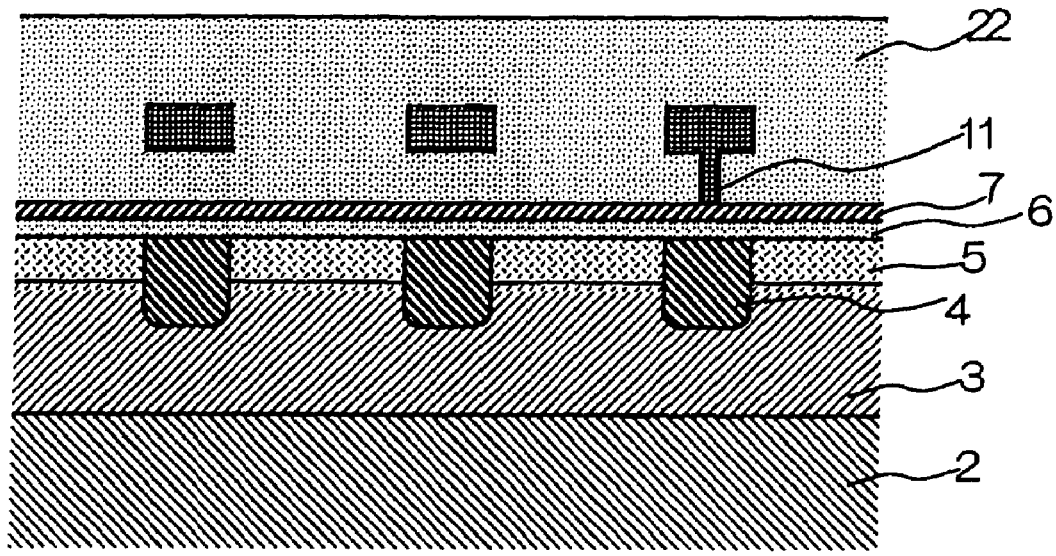
FIG. 6 is a cross-sectional view describing a fourth step in the solid state imager manufacturing method of the present invention.

Step 4: FIG. 6

A BPSG film is then laminated using a CVD process onto the first layer of insulating film in which the power supply lines 8 are formed, thus forming an insulating film 22 in combination with the first layer of insulating film. Because this BPSG film is subjected to an etching process in a subsequent step, in this fourth step the film is formed to a thickness which is thicker than the maximum thickness of the finished product. The surface of the BPSG film is then subjected to heat treatment to smoothen the surface of the insulating film 22.

Figure 7:
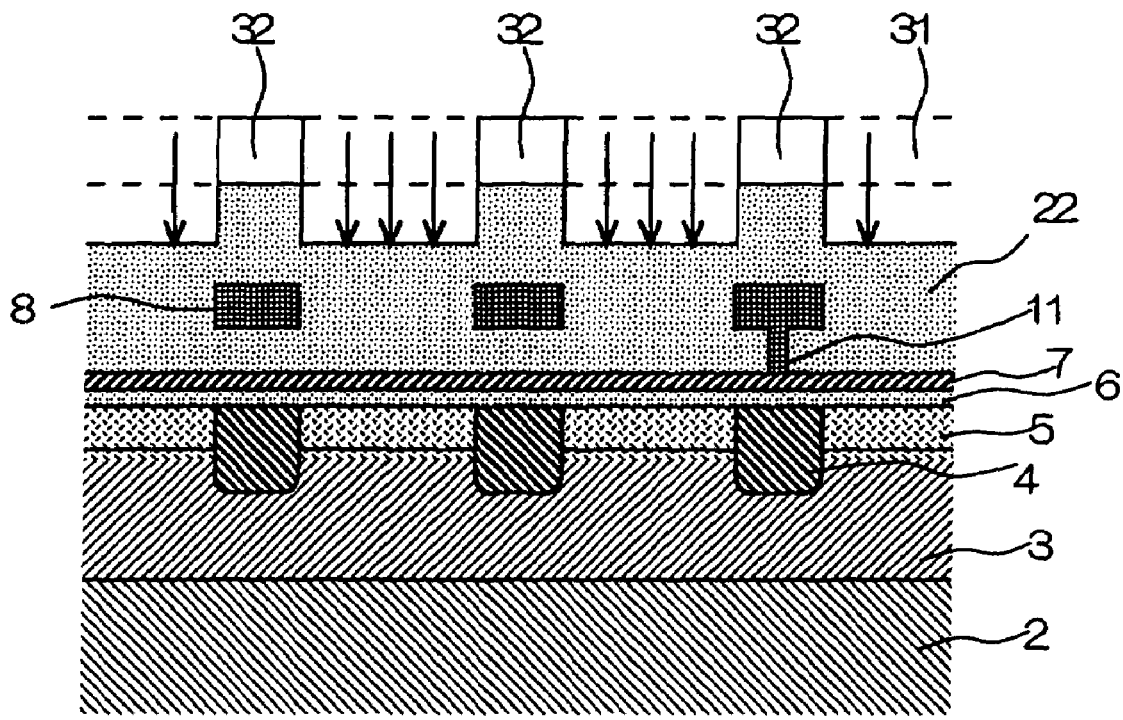
FIG. 7 is a cross-sectional view describing a fifth step in the solid state imager manufacturing method of the present invention.

Step 5: FIG. 7

A resist layer 31 is laminated onto the insulating film 22, and this resist layer 31 is patterned along the power supply lines 8, thus forming a mask pattern 32 which covers the power supply lines 8. An anisotropic etching process (for example dry etching) is then performed on the insulating film 22 using the mask pattern 32 as the mask, thereby reducing the film thickness of the insulating film 22 along the channel regions 5.

Figure 8:
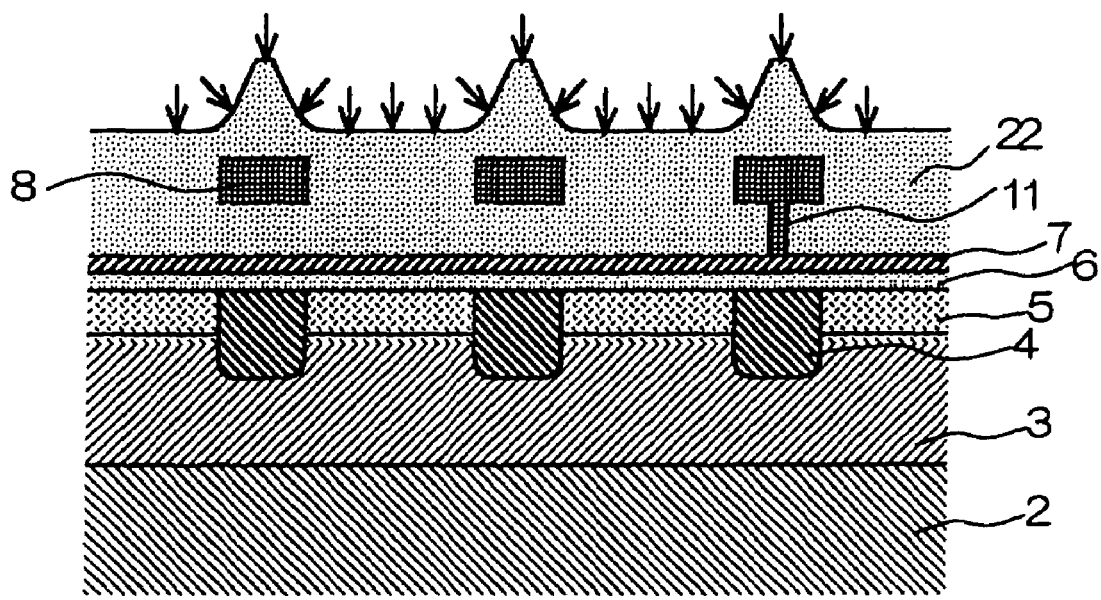
FIG. 8 is a cross-sectional view describing an optional step in the solid state imager manufacturing method of the present invention.

Optional Step: FIG. 8

The remaining mask pattern 32 on the insulating film 22 is removed, and an isotropic etching process (for example wet etching) is performed on the insulating film 22 which was subjected to the anisotropic etching process. By this isotropic etching process it is possible to form the insulating film 22 such that the film thickness becomes progressively thicker above the isolation regions 4 from the channel region 5 side towards the isolation region 4 side. In this manner, by using a method in which an isotropic etching process is performed after first performing an anisotropic etching process, it is even possible to easily form shapes with curved surfaces as shown in FIG. 1, for example. That is to say, the film thickness of the lower lens film 23 which derives from the interlayer insulating film 22 can be set freely within the processing time of the anisotropic etching process, and the angle of the curved portions of the lower lens film can be set freely within the processing time of the isotropic etching process. By suitably regulating these two etching processes, it is possible to form the desired shape accurately at a predetermined position over the power supply lines 8, even if the type of device is one where the width of the isolation regions 4 is extremely narrow, like a frame transfer type solid state imager. Here, this step is optional.

Figure 9:
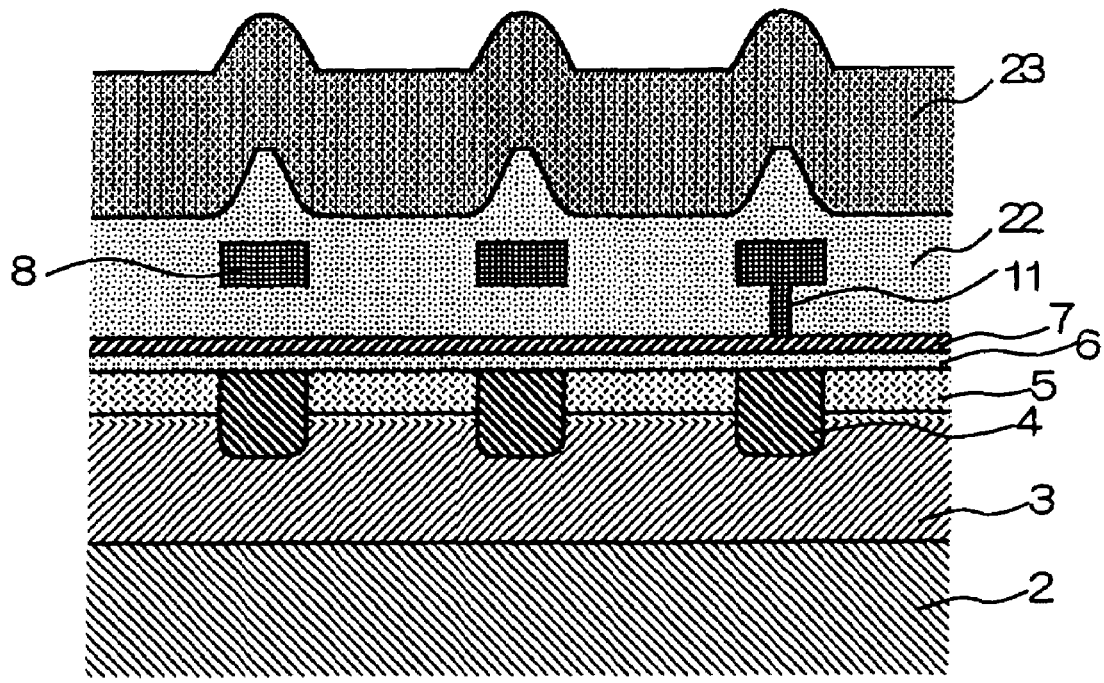
FIG. 9 is a cross-sectional view describing a sixth step in the solid state imager manufacturing method of the present invention.

Step 6: FIG. 9

A plasma CVD process is used to laminate silicon nitride onto the silicon substrate 1 on which the insulating film 22 is formed, thus forming the lower lens film 23 covering the entire surface of the insulating film 22. At this time, the surface of the lower lens film 23 reflects the concave and convex shape of the insulating film 22, forming gentle protrusions above the power supply lines 8.

Figure 10:
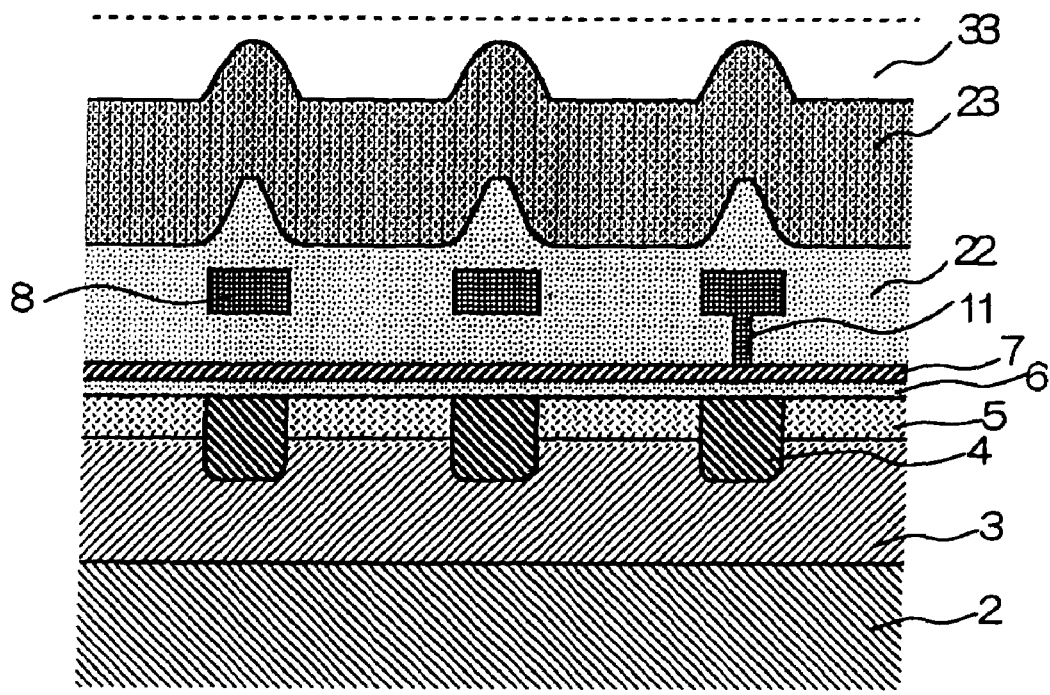
FIG. 10 is a cross-sectional view describing an initial stage of a seventh step in the solid state imager manufacturing method of the present invention.
Figure 11:
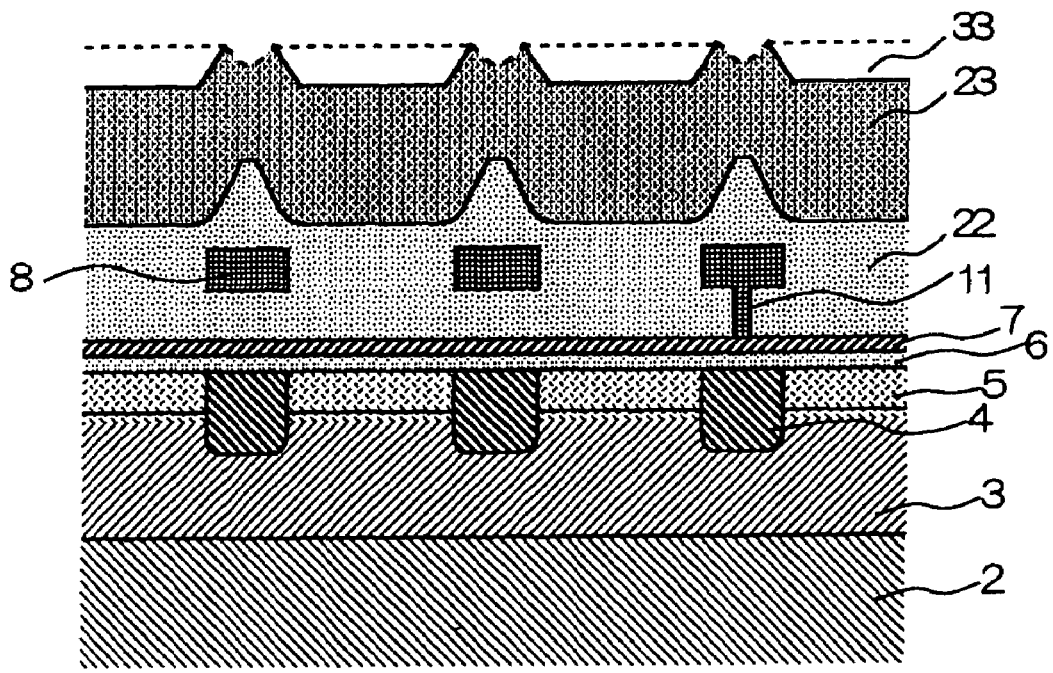
FIG. 11 is a cross-sectional view describing a middle stage of the seventh step in the solid state imager manufacturing method of the present invention.
Figure 12:
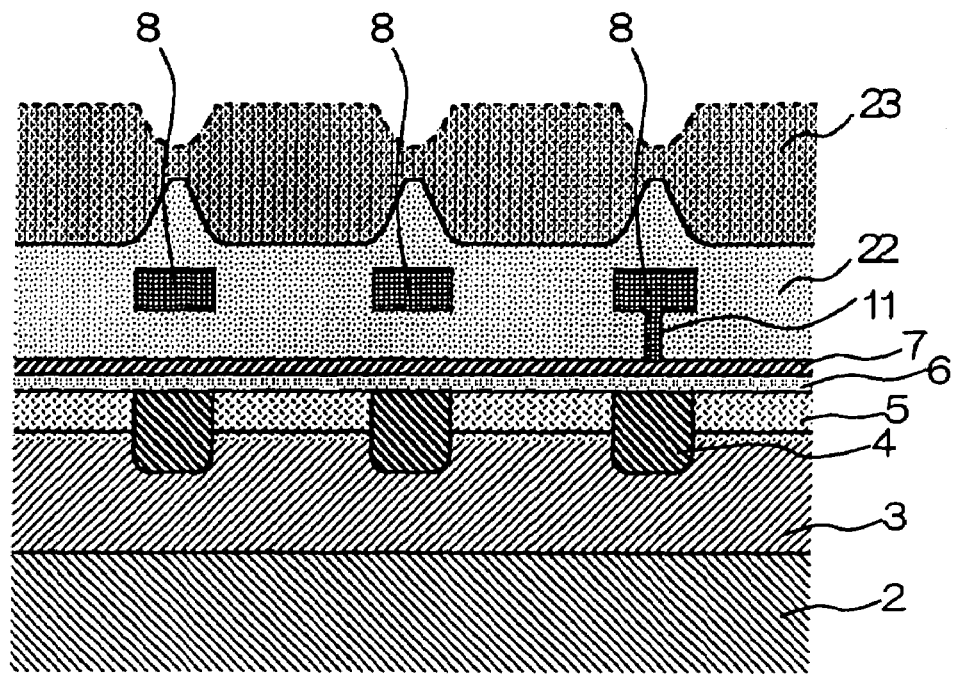
FIG. 12 is a cross-sectional view describing a final stage of the seventh step in the solid state imager manufacturing method of the present invention.

Step 7: FIG. 10 through FIG. 12

As shown in FIG. 10, the surface of the lower lens film 23 is rendered flat by applying a resist 33, for example, to the lower lens film 23. Subsequently, the surface of the resist 33 is etched back by means of an anisotropic etch back process. At this time, by selecting the mixing ratio of the etching gas appropriately, it is possible to obtain conditions under which the lower lens film 23 undergoes etching more readily than the resist 33. Consequently, as shown in FIG. 11 the parts where the lower lens film 23 is exposed to the etching gas are etched to a greater degree than the resist 33. As a result, when the entire resist 33 is etched away, the surface of the lower lens film 23 forms gentle concave sections above the power supply lines 8 as shown in FIG. 12.

Figure 13:
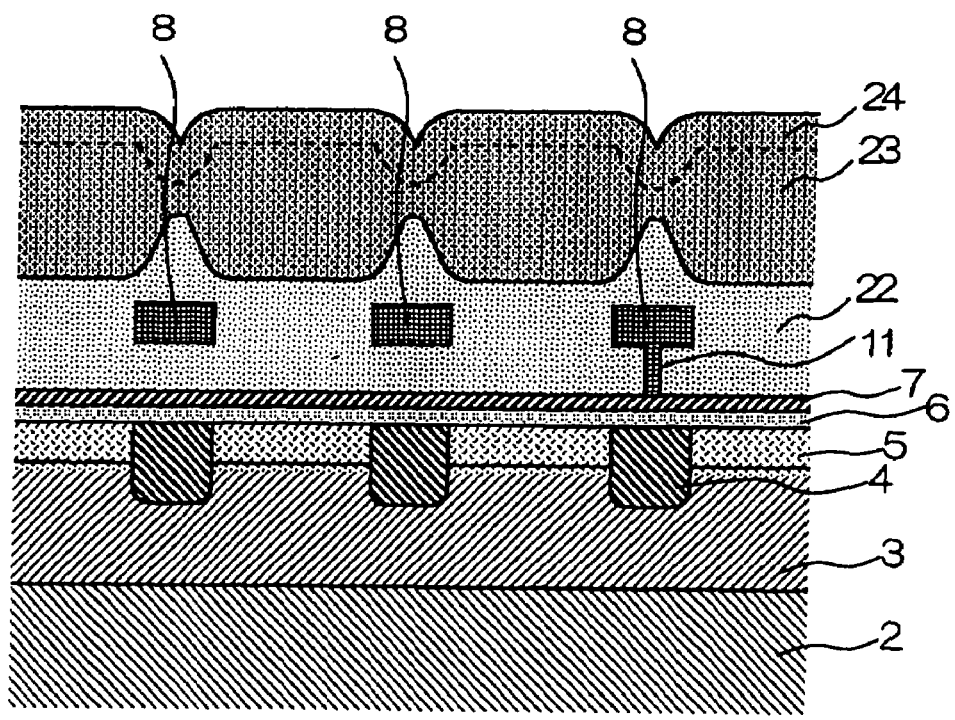
FIG. 13 is a cross-sectional view describing an eighth step in the solid state imager manufacturing method of the present invention.

Step 8: FIG. 13

A plasma CVD process is used to laminate silicon nitride onto the silicon substrate 2 on which the lower lens film 23 is formed, thus forming the upper lens film 24 covering the entire surface of the lower lens film 23. At this time, the surface of the upper lens film 24 forms gentle concave sections above the power supply lines 8. It is even possible to easily form shapes with curved surfaces as shown in FIG. 1, for example. That is to say, by setting the conditions of the lamination of the silicon nitride by the plasma CVD process appropriately, the film thickness of the upper part of the lens portion based on the upper lens film 24 can be set freely, and the angle of the curved portion of the upper part of the lens portion can be set freely.

If required silicon oxide is laminated using a plasma CVD process onto the silicon substrate 2 on which the upper lens film 24 is formed, to form a protective film covering the entire surface of the upper lens film 24. The surface of the protective film is then rendered flat by means of an etch back process or a CMP (Chemical Mechanical Polish) process.

According to the manufacturing method above, it is possible to obtain the solid state imager shown in FIG. 1 which has the lower lens film 23 and the upper lens film 24.

Figure 14:
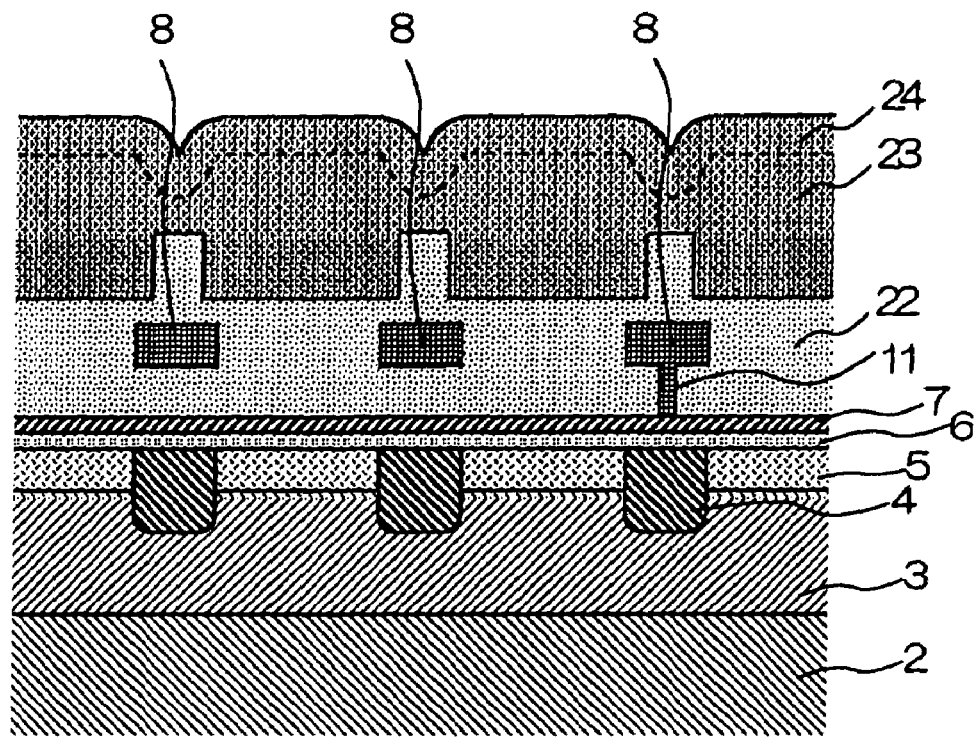
FIG. 14 is a cross-sectional view describing another embodiment of the present invention.
Figure 15:
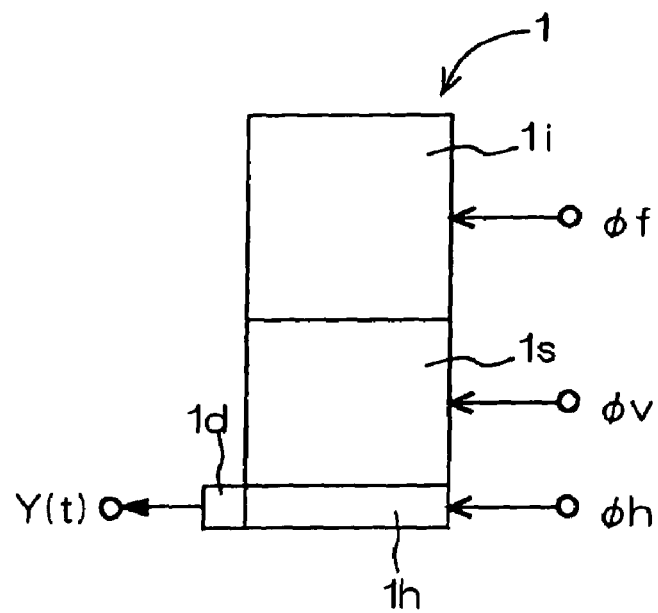
FIG. 15 is a plan view showing an outline of a construction of a conventional frame transfer type solid state imager.
Figure 16:
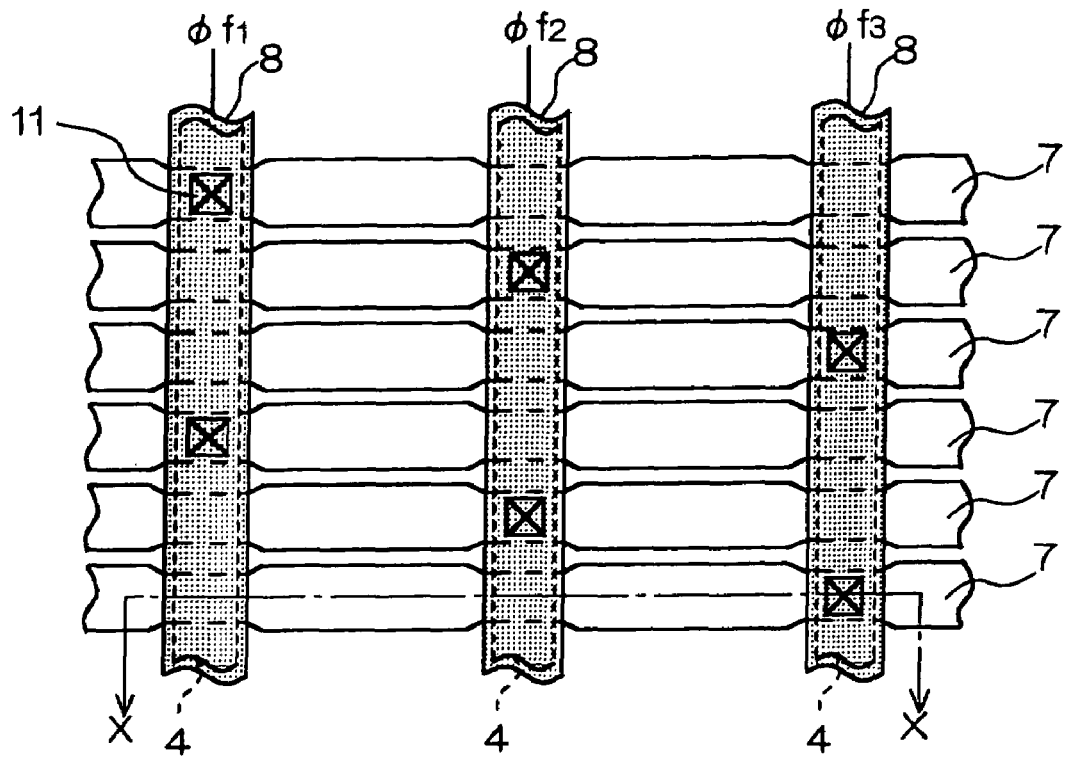
FIG. 16 is a plan view describing the construction of the imaging section.

FIG. 1 shows the construction of an embodiment of the solid state imager of the present invention manufactured by following the above steps 1 through 5, the optional step, and steps 6 through 8. However, the construction showing an embodiment of the solid state imager of the present invention manufactured without undergoing the optional step is shown in FIG. 14. In this construction also, by providing above the upper lens film 24 a light transmitting substance with a lower refractive index than that of the upper lens film 24, the upper lens film 24 functions as a prism above the power supply lines 8, and the light incident over the power supply lines 8 can be guided to the channel regions 5.

In addition to frame transfer type devices, the present invention can be applied of course to CCD type solid state imagers which use other transfer methods, as well as to MOS type, BBD (bucket-brigade device) type, and CID (charge injection device) type solid state imagers, and to intensified solid state imagers such as avalanche type devices.

According to the present invention, by forming a light transmitting upper lens film whose surface forms continuous convex portions above the isolation regions convex towards the channel regions, and providing a light transmitting substance over the upper lens film which has a refractive index lower than that of the upper lens film, the upper lens film can function as a prism above the power supply lines, guiding the light incident over the power supply lines, to the channel regions. Consequently, photoelectric conversion of the light irradiated onto the semiconductor substrate can be performed efficiently, and light sensitivity can be improved.

The invention claimed is:

1. A method of manufacturing micro lenses, the method comprising:
    an underlayer film etching step for etching a flat light transmitting underlayer film along a predetermined mask pattern to form convex regions between adjacent micro lens forming regions;
    a lens film laminating step for laminating a light transmitting lens film of a shape reflecting a shape of the underlayer film on the underlayer film; and
    an etching step for forming concave regions in the lens film over the convex regions by applying a resist over the lens film to flatten the surface of the lens film and applying an etching process under a condition that the lens film is more easily etched than the resist, wherein
    the lens film has a refractive index higher than that of a substance provided in a layer above the lens film.

2. A method of manufacturing micro lenses according to claim 1, wherein the underlayer film etching step comprises performing isotropic etching after anisotropic etching is performed.

3. A method of manufacturing micro lenses according to claim 2, wherein a substance provided over the underlayer film has a refractive index higher than that of the underlayer film.

* * * * *